United States Patent [19]

Zappe

[11] 3,913,027

[45] Oct. 14, 1975

[54] HIGH GAIN, LARGE BANDWIDTH AMPLIFIER BASED ON THE JOSEPHSON EFFECT

[75] Inventor: Hans Helmut Zappe, Granite Springs, N.Y.

[73] Assignee: International Business Machines Corporation, Armonk, N.Y.

[22] Filed: Feb. 11, 1974

[21] Appl. No.: 441,089

Related U.S. Application Data

[63] Continuation of Ser. No. 319,588, Dec. 29, 1972, abandoned.

[52] U.S. Cl......... 330/61 A; 330/38 M; 307/306 X; 357/5

[51] Int. Cl........................................... H03F 15/00

[58] Field of Search......... 330/61 R, 61 A; 317/234; 307/306 X; 357/5

[56] References Cited

UNITED STATES PATENTS

| | | | |
|---|---|---|---|
| 3,723,755 | 9/1973 | Morse | 307/306 X |
| 3,764,863 | 10/1973 | Zappe | 317/234;8.1 |
| 3,783,402 | 1/1974 | VanDerZiel et al. | 330/61 R |

*Primary Examiner*—Nathan Kaufman
*Attorney, Agent, or Firm*—Jackson E. Stanland; Thomas J. Kilgannon, Jr.

[57] ABSTRACT

A wide band linear amplifier comprising first and second heavily damped Josephson devices and associated superconducting circuitry. Each Josephson device has a parallel path with a load resistor connected thereto. The parallel path connected to the first Josephson device is positioned to operate as a control current path for the second Josephson device. Both Josephson devices are operated on linear portions of their respective gain curves. The output current through the second load resistance is a linear amplification of the input current; the latter being applied as control current to the first Josephson device.

16 Claims, 3 Drawing Figures

HIGH GAIN, LARGE BANDWIDTH AMPLIFIER BASED ON THE JOSEPHSON EFFECT

This is a continuation of Ser. No. 319,588, filed 12/29/72, now abandoned.

BACKGROUND OF THE INVENTION

The invention is in the field of Josephson device circuits and more particularly is a wide band linear amplifier using Josephson devices.

As is well known in the art there is a class of cryogenic devices which are known as Josephson devices. The voltage across a Josephson device will remain at zero for apllied currents up to a critical value $I_m$ and will jump to a finite value for applied currents in excess of $I_m$. Additionally, the critical current $I_m$ varies with magnetic field applied to the device. It is common in many applications to apply the magnetic field by passing a control current $I_c$ through a superconductor overlying and electrically insulated from the Josephson device. The curve of critical current $I_m$ versus control current $I_c$ is known as the gain curve of the device. Such devices have been used as switching elements of logic circuits For a given gating current $I_g$ applied to a Josephson device, the control current $I_c$ is varied to raise and lower the critical current $I_m$ relative to the gating current. This causes the Josephson device to switch from the $V = 0$ to the $V \neq 0$ state.

It has been shown by D. E. McCumber in the Journal of Applied Physics, vol. 39, pg 3113, June 1968, that the time averaged voltage, V, across Josephson devices satisfying the equation, $$1.\quad CR^2 I_m < \Phi_o/2\pi,$$

is related to the current, $I_g$, flowing through the device by, $$2.\quad V^2 = R^2[I_g^2 - I_m^2], \text{ where}$$

$C$ = device capacitance;
$R$ = total damping resistance across the device;
$I_m$ = Josephson threshold current; and
$\Phi_o$ = magnetic flux quantum.

Josephson devices satisfying equation (1) above are heavily damped and have a single valued $I - V$ characteristic (i.e., no hysteresis in the $I - V$ curve). Typical examples of Josephson devices satisfying equation (1) are junctions, constrictions and point contacts. It will be appreciated that Josephson devices can be made to satisfy equation (1) by adding a resistor across the junction.

By placing an external resistive load $R_L$ across the device, the time averaged current $I_L$ through said load is given by $$3.\quad I_L^2 = \frac{R^2}{R_L^2}(I_g^2 - I_m^2)$$

With a control current $I_c$ applied, and since $I_m$ is a function of $I_c$, i.e., $I_m = L\,(I_c)$, the load current is defined as, $$4.\quad I_L = \frac{R}{R_L}\sqrt{I^2 - L^2(I_c)}.$$

In many Josephson devices $I_m$ varies greatly for small variations in $I_c$. The actual functional relationship between $I_m$ and $I_c$ depends upon device configuration and geometry as well as on the effect of self-field either intrinsic or obtained through magnetic feed-back. Furthermore, as taught in U.S. Patent No. 3,764,863 issued on Oct. 9, 1973 which matured from Pat. Ser. No. 158,315, filed by Zappe on June 30, 1971 and entitled, "High Gain Josephson Device," the gain curve, or functional relationship between $I_c$ and $I_m$, can be tailored, and even made linear for finite variations in $I_c$, i.e., the function can be tailored to achieve, $$5.\quad I_m = KI_c,$$

for finite variations of $I_c$. For some Josephson devices with large current densities, equation (5) is satisfied without the need for additional tailoring.

From equations (4) and (5) it will be appreciated that a Josephson device circuit having an input current $I_c$ and an output $I_L$, where, $$6.\quad I_L = \frac{R}{R_L}\sqrt{I_g^2 - K^2 I_c^2},$$

will act as an amplifier with essentially unlimited gain. However, despite the linear relationship between $I_c$ and $I_m$, the circuit remains nonlinear.

SUMMARY OF THE INVENTION

In accordance with the present invention, a wide band linear amplifier is provided comprising a two stage Josephson circuit. The input to the amplifier is provided as a control current to a first Josephson device which is heavily damped and has a linear gain curve for finite variations of the control current. The load current through a resistor in parallel with the first Josephson device, is applied as a control current to a second Josephson device which also is heavily damped and has a linear portion in its gain curve. The resulting load current through a resistive load in parallel with the second Josephson device will be linearly related to the input current $I_c$ provided the ratio of the gate currents applied to the second and first Josephson devices is set approximately equal to $$\frac{kR_1}{R_L},$$

where $k$ is the slope of the gain curve of the second Josephson device in the operation region, $R_1$ is the damping resistance of the first Josephson device, and $R_L$ is the load resistance in parallel with the first Josephson device.

DETAILED DESCRIPTION OF THE PREFERRED EMBODIMENT

Figure 1:
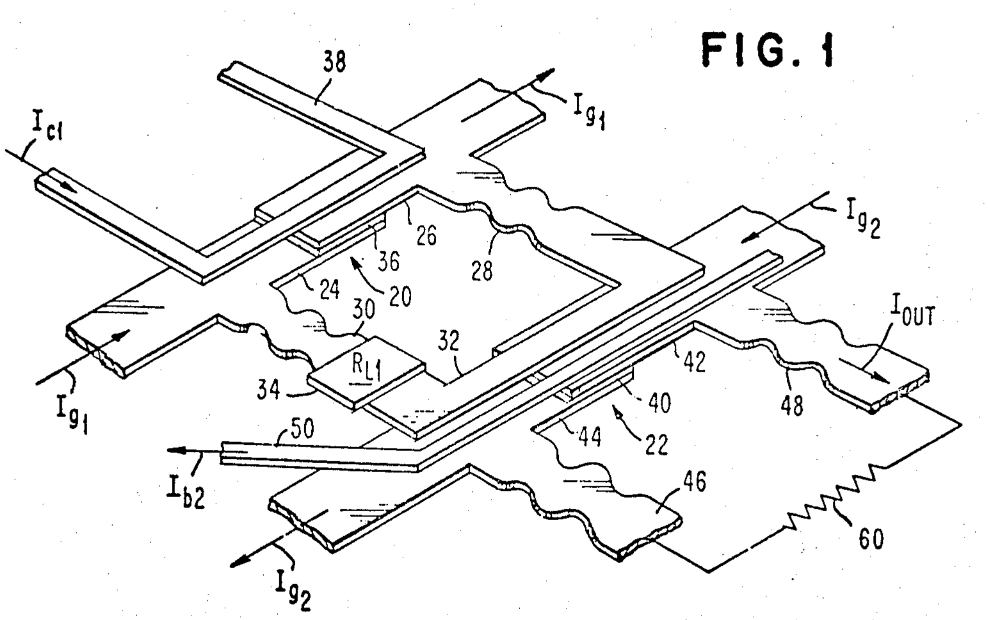
FIG. 1 illustrates a wide band linear amplifier constructed according to the teaching of this invention.

The preferred embodiment of the invention is illustrated in FIG. 1 and comprises two Josephson device circuits. The first Josephson device circuit comprises, Josephson junction 20, formed by superconductors 24, 26 and tunnelling oxide 36. The circuit also includes superconductor 24, 26, 28 32 and 30, resistive load 34, and control current superconductor 38. The second circuit comprises Josephson junction 22 formed by superconductors 44 and 42 and tunnelling oxide 40. The second circuit further comprises superconductors 42, 44, 46 and 48 and resistive load 60. The current through superconductor 32 operates as control current for Josephson junction 22. An additional control carrying superconductor 50 may also be provided to carry a biasing control current as will be explained in greater detail hereafter.

The superconductors 38, 32 and 50 overlay and are insulated from the respective Josephson devices as is well known in the art. Also, as is well known in the art, the circuit illustrated overlies and is insulated from a ground plane, not shown. The Josephson devices 20 and 22 are heavily damped, i.e., satisfy equation (1) above, and have a linear relationship between $I_c$ and $I_m$ over a finite range of $I_c$, i.e., satisfy equation (5) above.

A general explanation of the wide band linear amplification of the circuit will now be described using subscripts 1 and 2 to designate parameters of the first and second stages respectively.

The critical current $I_{m_1}$ for the first stage Josephson device is given by, $$7.\ I_{m_1} = kI_{c_1},$$

where $I_{c_1}$ is the input control current and $k$ is a constant.

From equations (3) and (7), the load current, $I_{L_1}$, through resistor 34 becomes, $$8.\quad I_{L_1}^2 = \frac{R_1^2}{R_{L_1}^2} I_{g_1}^2 - \frac{R_1^2}{R_{L_1}^2} k^2 I_{c_1}^2,$$

where $R_1$ is the total damping resistance of Josephson device 20, $R_{L_1}$ is the load resistance 34, and $I_{g_1}$ is the gating current applied to the circuit.

The critical current, $I_{m_2}$, of the second Josephson device 22 is, $$9.\ I_{m_2} = KI_{c_2} = KI_{L_1},$$

where K is a constant and $I_{c_2}$ is the control current. The load current, $I_{L_2}$, through resistance 60, thus satisfies the equation, $$10.\quad I_{L_2}^2 = \frac{R_2^2}{R_{L_2}^2} I_{g_2}^2 - \frac{R_2^2}{R_{L_2}^2} K^2 I_{L_1}^2,$$

where $R_2$ is the damping resistance of Josephson device 22, $R_{L_2}$ is the load resistance 60, and $I_{g_2}$ is the gating current applied to the second stage.

Substituting for $I_{L_1}^2$ from equation (8), we obtain, $$11.\quad I_{L_2}^2 = \frac{R_2^2}{R_{L_2}^2} I_{g_2}^2 - \frac{R_2^2}{R_{L_2}^2} k^2 \frac{R_1^2}{R_{L_1}^2} I_{g_1}^2 + \frac{R_2^2}{R_{L_2}^2} k^2 \frac{R_1^2}{R_{L_1}^2} k^2 I_{c_1}^2.$$

If we choose the ratio of the drive currents to be, $$\frac{I_{g_2}}{I_{g1}} = K \frac{R_1}{R_{L_1}}$$

the output current $I_{L2}$ becomes, $$I_{L2} = \frac{R_2 R_1 K k}{R_{L2} R_{L1}} I_{c1}.$$

Thus, the output current $I_{L_2}$ is linearly related to $I_{c_1}$. Since it is possible to obtain (K) ($k$) >>1, the ratio of total damping resistance, $R_2R_1$, to total load resistance, $R_{L2}R_{L1}$, can be made small compared to 1 and still result in high gain. However, the higher the ratio, the higher the gain.

The bandwidth of the amplifier is very large since current changes will occur with a time constant, $$CR < \frac{\phi_o}{2\pi R I_m}.$$

with $R \approx 0.02$ and $I_m \approx 30$ mA, $RC \approx 10^{-12}$ sec.

As is well known, Josephson devices produce Josephson oscillations at approximately 500MHz/μV. Since we are operating in the millivolt range, the Josephson oscillations will be at approximately 500 gigahertz. It may not be necessary to filter out these oscillations, but standard high frequency filtering techniques may be used to damp the Josephson oscillations. One particular known technique for accomplishing the filtering is to provide wavy construction of superconductor lines 30, 28, 46 and 48 as illustrated in FIG. 1. Assuming that the attenuation of the Josephson components requires a maximum time constant of $10^{-11}$ seconds, we obtain a bandwidth of the circuit varying from d.c. to approximately 30 gigahertz.

Figure 2A:
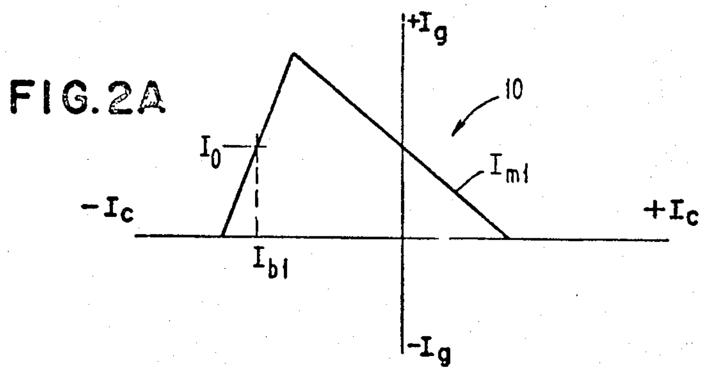
FIGS. 2a and 2b are graphs of gain curves for the Josephson devices illustrated in FIG. 1.
Figure 2B:
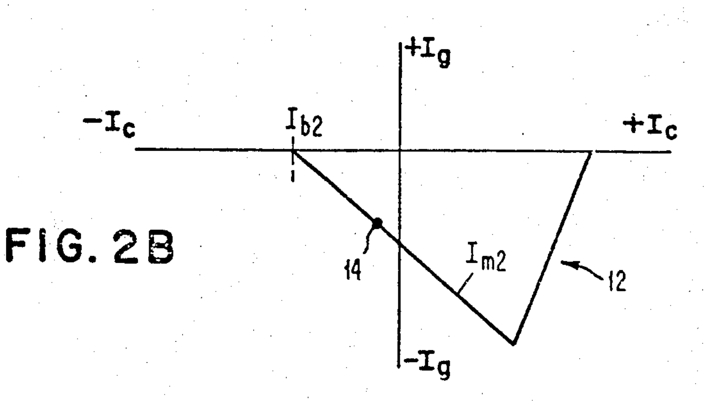

A more specific example of the Josephson device linear amplifier will now be described with reference to FIGS. 1, 2A and 2B. For purposes of this explanation, the two Josephson devices are substantially identical and their gain curves are illustrated in FIGS. 2A and 2B, respectively. In each of FIGS. 2A and 2B, the polarity of $I_g$ determines whether the portion of the gain curve above or below the abscissa is the operating portion of the gain curve. In FIG. 2A, representing device 20, curve 10 represents the operating portion, whereas in FIG. 2B, representing device 22, curve 12 represents the operating portion of the gain curve. Curves 10 and 12 are identical except that the respective gating currents are assumed to be positive and negative, respectively. Referring to FIG. 1, the direction of $I_{g1}$ is assumed to be the positive current direction, and the direction of $I_{g_2}$ is assumed to be the negative current direction. This applies to control currents as well as gating currents. It can be seen from FIGS. 2A and 2B that, over limited $I_c$ ranges, the gain curves are linear. The gradual slopes of curves 10 and 12 each have a magnitude of ≈ 1; the steeper slopes have magnitudes = K.

In this example, the gate currents are selected to satisfy the equation:

$$\frac{I_{g_2}}{I_{g_1}} = (K)\left(\frac{R_1}{R_{L_1}}\right) = (-1)(1) = -1.$$

i.e., $R_{L_1}$ is selected ≈ $R_1$, $I_{g_1}$ and $I_{g_2}$ have the same magnitude, and k is −1.

Since the gate current $I_{g1}$ flows in the positive direction, the curve 10 represents the gain curve for $I_{m1}$. A bias control current $I_{b1}$, is selected to place the operating point of the device at $I_{m1} = I_o$ for no input current $I_{in}$. The bias current, which is a negative control current having a value $I_{b1}$, may be applied via control current superconductor 38 or via a separate bias current superconductor overlaying and insulated from Josephson device 20. The input current, $I_{in}$, thus will vary $I_{m1}$ along the steep positive slope and $$I_{m1} = I_o + KI_{in},$$

where K is the slope of the gain curve and K >> 1.

The load current through $R_{L1}$ is $$I_{L1} = \sqrt{I_{g1}^2 - I_{m1}^2};$$

$$I_{L1} = \sqrt{I_{g1}^2 - (I_o + KI_{in})^2}$$

The gate current through the second device is also selected as described above to be equal to $-I_{g1}$.

The bias $I_{b2}$ is selected as shown in the graph. Since the slope of the curve 12 is −1, it can be seen that $$I_{m2} = -(1)(I_{L1}) = -I_{L1}$$

It should be understood that in the absence of input current $I_{in}$, the current $I_{L1}$ due to the bias $I_{b1}$, above, plus the negative bias $I_{b2}$ places the operating point of the gain curve 12 along the negative slope, for example at point 14.

From earlier equations, $$I_{out}\sqrt{= \quad I_{g1}^2 - I_{m2}^2};$$

if $R_{L2}$ is $\approx R_2$;

$$I_{out}\sqrt{= \quad I_{g1}^2 - I_{L1}^2}$$

$$I_{L1}^2 = I_{g1}^2 - (I_o + KI_{in})^2$$

$$I_{out}\sqrt{= \quad _{Ig1}^2 - I_{g1}^2 + (I_o + KI_{in})^2}$$

$$I_{out} = I_o - KI_{in}$$

Thus, the input signal is amplified by K and may be of either polarity since it is centered about $I_o$. To suppress $I_o$ is well known in the art since a d.c. bias at the output occurs in almost all amplifiers.

Since the circuit shown in FIG. 1 behaves essentially as a transistor, it is also able to perform all of a transistor's circuit functions. It can thus be used to construct not only amplifiers but oscillators, flip-flops, single shots, etc. Additionally, it should be noted that because of the low operating temperature (4°K) the signal to noise ratio will exceed that of any device with comparable bandwidth.

What is claimed is:

1. A wide band linear amplifier comprising, a. first and second Josephson devices, each having a gain curve which is linear over a finite range of control current, and each being heavily damped and having damping resistances $R_1$ and $R_2$ respectively, b. a first superconducting circuit including said first Josephson device and further comprising a superconducting path having a load resistance $R_{L1}$ therein in parallel circuit arrangement with said first Josephson device, and further superconductors for carrying a gating current $I_{g1}$ to said parallel arrangement, c. a second superconducting circuit including said second Josephson device and further comprising a superconducting path having a load resistance $R_{L2}$ therein in parallel circuit arrangement with said second Josephson device, and further superconductors for carrying a gating current $I_{g2}$ to said parallel arrangement, d. said superconducting path having load resistance $R_{L1}$ therein being positioned so that a portion thereof overlies said second Josephson device in a direction parallel to the direction of current flow through said second Josephson device, and e. an input control current superconductor for carrying input control current positioned to overlie said first Josephson device parallel to the direction of current flow through said first Josephson device.

2. A wide band linear amplifier as claimed in claim 1 wherein the gating currents $I_{g1}$ and $I_{g2}$ satisfy the condition, $$\frac{I_{g2}}{I_{g1}} \approx K \frac{R_1}{R_{L1}}$$

where K is the slope of a portion of the gain curve of said second Josephson device.

3. A wide band linear amplifier as claimed in claim 2 wherein each of said first and second Josephson devices satisfies the equation, $$CR^2I_m < \Phi_o/2\pi,$$

where, C is the device capacitance,

R is the total damping resistance across the device, $I_m$ is the Josephson threshold current, and $\Phi_o$ is the magnetic flux quantum.

4. A wide band linear amplifier as claimed in claim 3 further comprising separate bias control current superconducting means for carrying a bias control current for said second Josephson device, and means overlying said second Josephson device in a direction parallel to the current direction through said second Josephson device.

5. A wide band linear amplifier as claimed in claim 4 wherein said parallel superconducting paths having said load resistances $R_{L1}$ and $R_{L2}$ therein, respectively, further include ultra high frequency filtering means for removing Josephson oscillations from the load current flowing through said load resistances $R_{L1}$ and $R_{L2}$.

6. An apparatus comprising:

first and second devices in which Josephson current can flow, said devices exhibiting substantially no hysteresis when switched, each device having a gain curve which is linear over a finite range of control current and each of which is heavily damped by an external resistance, said devices having first and second total damping resistances $R_1$ and $R_2$ respectively, a first circuit including said first device and having a load resistance $R_{L1}$ therein, said first circuit being connected to said first device, a source of a gating current $I_{g1}$ for providing current through said first device, a second circuit including said second device and having a load resistance $R_{L2}$ therein, said second circuit being connected to said second device, a source of a gating current $I_{g2}$ to said second device, said first circuit connected to said first device being positioned so that current through said first circuit controls said second device and, means for providing control signals for regulating said first device.

7. The apparatus of claim 6, wherein the gating currents $I_{g1}$ and $I_{g2}$ satisfy the condition $$I_{g2}/I_{g1} \approx K(R_1/R_{L1}),$$

where K is the slope of a portion of the gain curve of said second device.

8. The apparatus of claim 7, wherein said first and second devices are damped by the resistances $R_{L1}$ and $R_{L2}$, respectively.

9. The apparatus of claim 8, where said first and second devices satisfy the inequality.

$$CR^2I_m < \Phi_o/2\pi,$$

where C is the device capacitance,

R is the total damping resistance across each device, $I_m$ is the maximum current through each tunnel device, and $\Phi_o$ is the magnetic flux quantum.

10. The apparatus of claim 6, wherein said first and second circuits include filtering means for removing Josephson oscillations from the currents which flow through said load resistances $R_{L1}$ and $R_{L2}$.

11. An apparatus comprising:

a first device capable of supporting Josephson current therethrough, said first device being connected to a first circuit having a resistance $R_{L1}$ which heavily damps said first device wherein the total damping resistance of said first device is $R_1$, a second device capable of supporting Josephson current therethrough, said second device being connected to a second circuit having a resistance $R_{L2}$ which heavily damps said second device, means for providing electrical currents $I_{g1}$ through said first device and $I_{g2}$ through said second device, where the ratio $I_{g2}/I_{g1}$ bears a linear relationship to the ratio $R_1/R_{L1}$, control means for switching said first device to transfer at least a portion of said current $I_{g1}$ into said first circuit, wherein said first circuit is positioned with respect to said second device that current in said first circuit controls said second device.

12. The apparatus of claim 11, where said first device has a maximum Josephson current $I_{m1}$ and said control means carries a current $I_{c1}$, where $I_{m1}$ is a linear function of $I_{c1}$ over a range of $I_{c1}$.

13. The apparatus of claim 12, where said second device has a maximum Josephson current $I_{m2}$ which is linearly related to the magnitude of said control magnetic field over a range of said control magnetic field.

14. The apparatus of claim 13, further including means for filtering Josephson oscillations from the currents flowing through said load resistances $R_{L1}$ and $R_{L2}$.

15. An apparatus comprising:

a first device capable of supporting Josephson tunneling current therethrough said first device being connected to a first circuit having a resistance $R_{L1}$, a second device capable of supporting Josephson tunneling current therethrough said second device being electrically connected to said first circuit and to a second circuit having a resistance $R_{L2}$ associated therewith, wherein said first and second devices exhibit substantially no hysteresis when switched, and control means for switching said devices.

16. The apparatus of claim 15, where said resistance $R_{L1}$ heavily damps said first device and said resistance $R_{L2}$ heavily damps said second device.

* * * * *